United States Patent [19]

Maruyama et al.

[11] Patent Number: 4,845,671

[45] Date of Patent: Jul. 4, 1989

[54] BLOCH LINE MEMORY DEVICE

[75] Inventors: Youji Maruyama, Iruma; Tadashi Ikeda, Kanagawa; Teruaki Takeuchi, Koganei; Ryo Suzuki, Hachioji, all of Japan

[73] Assignee: Hitachi, Ltd., Tokyo, Japan

[21] Appl. No.: 225,318

[22] Filed: Jul. 28, 1988

[30] Foreign Application Priority Data

Jul. 29, 1987 [JP] Japan .................. 62-187742

[51] Int. Cl.$^4$ .............................. G11C 19/08
[52] U.S. Cl. ................................ 365/87; 365/29
[58] Field of Search ...................... 365/87, 29

[56] References Cited

U.S. PATENT DOCUMENTS 4,583,200 4/1986 Konishi et al. ................ 365/29

OTHER PUBLICATIONS

Journal of Applied Physics–vol. 49, No. 3, Mar. 1978, pp. 18-31 to 1833.

Primary Examiner—James W. Moffitt
Attorney, Agent, or Firm—Pennie & Edmonds

[57] ABSTRACT

A Bloch line memory device and a method of erasing information in which, for erasure of a Bloch line pair representative of one bit of information and located in one end portion of one stripe domain, the stripe domain is stretched by decreasing the intensity of a bias magnetic field, an erasure Bloch line pair having a rotation of magnetization opposite to that of the to-be-erased Bloch line pair is injected into the end portion of the stretched stripe domain by supplying a current pulse signal to a conductor arranged substantially perpendicualr to the lengthwise direction of the stripe domain, and the stretched stripe domain is shrinked by restoring the intensity of the bias magnetic field, so that the to-be-erased Bloch line pair is combined with the erasure Bloch line pair to cancel the former.

9 Claims, 8 Drawing Sheets

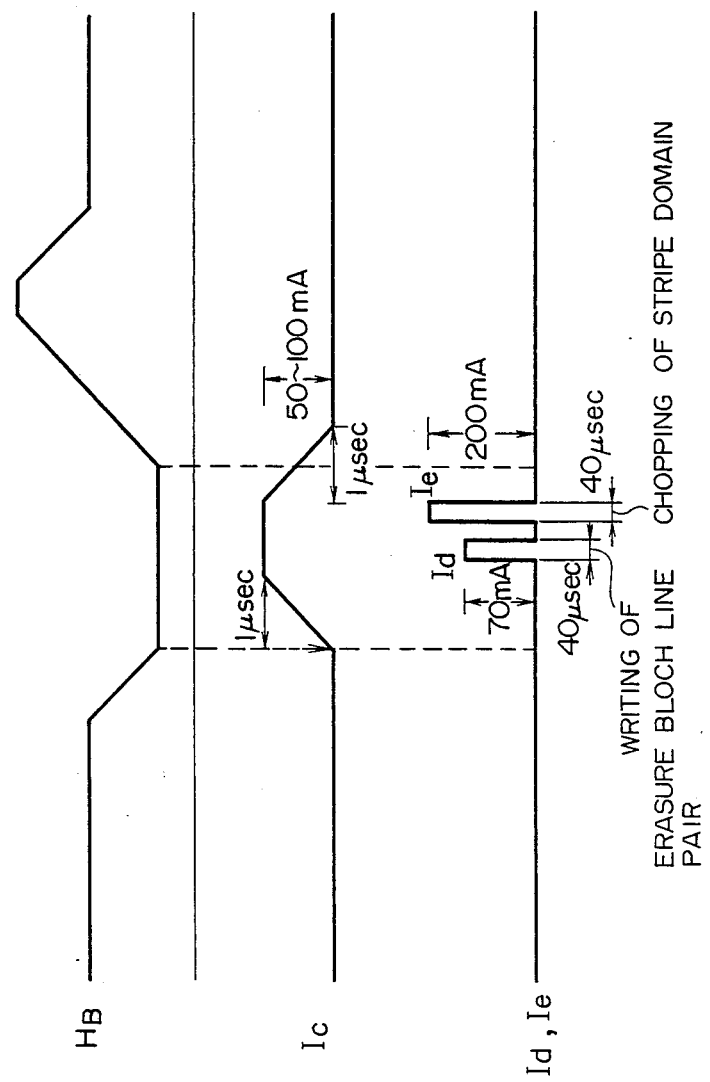

BLOCH LINE MEMORY DEVICE

BACKGROUND OF THE INVENTION

The present invention relates to a solid magnetic memory and more particularly to a Bloch line memory device suitable to realize a large capacity solid file memory.

A previously well known technique for erasing stored information in the Bloch line memory device is disclosed in U.S. Pat. No. 4,583,200 to Konishi et al issued Apr. 15, 1986. This technique erases information by shifting a to-be-erased Bloch line pair to the end portion of a stripe magnetic domain constituting a storage loop and thereafter chopping the end portion to extrude the to-be-erased Bloch line out of the stripe magnetic domain.

The conventional Block line memory device is constituted as schematically shown in FIG. 1. More specifically, the conventional Bloch line memory device is constituted by a chip 12, a magnetic circuit 16 for generating a magnetic field necessary to operate the chip, and a controller 17 for controlling the operation of the chip 12. The chip 12 includes an information writing/propagation line (major line) conductor 14 which is provided with a bubble generator 19 formed on a magnetic garnet substrate through a predetermined fabrication process, an information read-out/propagation line (major line) conductor 15 provided with a bubble erasure portion 18 and a number of stripe magnetic domains 13 serving as storage loops located in the substrate. In operation, information is converted into the presence or absence of a magnetic bubble 20 on the information writing/propagation line 14 by the controller 17, which, in turn, is converted into the presence or absence of a Bloch line pair through a predetermined gate operation, which is stored on the magnetic walls of the strip magnetic domains 13.

The stored information is erased, as the case demands. In the Bloch line memory device, an erasing command is applied to the controller 17. The controller 17, upon receipt of the erasing command, supplies a predetermined current to a predetermined conductor and the magnetic circuit 16 to accomplish an erasing operation. Then, the operation in the controller 17 is generally advanced in the order as shown in FIG. 2. In the conventional technique, the Bloch line pair corresponding to information to be erased is chopped, in the state where it is included in a magnetic bubble domain from the head of a stretched stripe domain 13. Thus, the information erasing is completed with erasing the chopped magnetic bubble.

Meanwhile, the chip 12 includes many stripe domains 13 serving as storage loops arranged in parallel between the writing/propagation line (major line) 14 and the read-out/propagation line (major line) 15, and the chopped bubble domain is propagated along the major line 15 as in the conventional magnetic bubble memory device and erased by the bubble erasure section 18 provided at the end portion of the major line 15. Therefore, as shown in FIG. 2, in the prior art technique, it was necessary to erase the bubble domains successively chopped in the read-out/propagation line by repeating the bubble domain propagation and the bubble domain erasure.

The number of the chopped bubble domains is equal to that of the storage loops so that this repeating operation took a long time, which made it impossible to operate the conventional Bloch line memory at a high speed.

Further, in the prior art technique, since the end portion of a stripe domain is chopped for an erasure operation, it was necessary to shift to-be-erased Bloch lines to the end portion of a storage loop (stripe domain) and to erase them. To this end, it is necessary to bring the storage section and the erasure section close to each other. However, the magnetic field necessary for the erasure operation is so strong that it will necessarily influence the Bloch lines existing in the magnetic wall. Thus, if the erasure section is located in the neighborhood of the storage section, the other Bloch lines existing in the storage section are influenced. For example, the stored information may be inverted ("0"→"1" or "1"→"0") or undesired information will be written.

To prevent this, it is necessary to carry out the erasure operation at the position separated from the storage section by shifting the to-be-erased Bloch line pair to the end portion of the stripe domain constituting a storage loop and thereafter stretching the stripe domain using a technique of e.g. varying the bias vertical magnetic field. However, this method is inconvenient in that in stretching the stripe domain, a gyroscopic force is exerted to the to-be-erased Bloch line pair at the head of the stripe domain and the Bloch line pair is shifted from the end portion of the stripe domain to a side thereof. This provides a difficulty in that even if the head of the stripe domain is chopped, the to-be-erased Bloch line pair is not taken out together with the bubble domain, thereby making it impossible to erase the information.

SUMMARY OF THE INVENTION

An object of the present invention is to provide a Bloch line memory device which can erase a Bloch line pair having information to be erased in such a manner as not influencing information in a storage section and a method for erasing the information in the Bloch line memory device.

In accordance with one aspect of the present invention, an additional Bloch line pair which has a magnetization structure different from i.e. magnetization rotation direction opposite to a Bloch line pair which is an information carrier is written at a location apart from the information storage section and thereafter these Bloch line pairs are combined with each other.

An erasure procedure adapted to a chip controller in order to attain the above object is such as shown in FIG. 7.

In the Bloch line memory device, two Bloch lines in pair constitute one information carrier. These two Bloch lines have the same rotation direction of magnetization and have magnetization directions 180° different from each other at their center portion. These conditions are disclosed in U.S. Pat. No. 4,583,200 mentioned above. The Bloch line pair that does not satisfy the above conditions, e.g. the Bloch lines having different rotation directions of magnetization can not be used as an information carrier since they disappear when they are combined with each other.

The present invention erases a desired Bloch line pair using the above intrisic property of a Bloch line. More specifically, an erasure Bloch line, having the rotation direction of magnetization opposite to that of a to-be-erased Bloch line pair, is injected into a location near the to-be-erased Bloch line pair in one end portion of a stripe domain having the to-be-erased Bloch line pair, and the to-be-erased Bloch line pair and the injected Bloch line pair are combined to cancel each other. Thus, the information can be erased.

In one embodiment of the present invention, the process of erasing information in the Bloch line memory device is such as schematically shown in FIG. 3. It is not necessary to repeat the propagation and erasure of a bubble domain, which was necessary in the prior art, so that the device can be operated at a high speed.

In accordance with one embodiment of the present invention, the following meritorious effects can be provided. It is not necessary to shift a to-be-erased Bloch line pair to the head of a stripe domain in its stretched state. Namely, the to-be-erased Bloch line pair has only to be located at any position of the end portion of the stretched stripe domain. Therefore, an erasure error which is a problem of failing in chopping due to the absence of a Bloch line pair at the head, which occured in the prior art, is no longer encountered with. Also, the erasure operation (i.e. writing a Bloch line pair for erasure) is carried out at a position apart from the storage portion so that the other Bloch lines existing in the storage section is not influenced.

Further, a bubble domain is not produced during the erasure operation so that its propagation and erasure are not required, thus permitting the device to be operated at a high speed. For example, the erasure operation in the present invention can take only 2 msec while that in the prior art took about 10 msec.

BRIEF DESCRIPTION OF THE DRAWINGS

FIGS. 9, 10 and 11 are diagrams showing the operation sequences of the embodiments shown in FIGS. 5a to 5e, FIGS. 6a to 6e, and FIGS. 7a to 7e, respectively.

DESCRIPTION OF THE PREFERRED EMBODIMENTS

Figure 4:
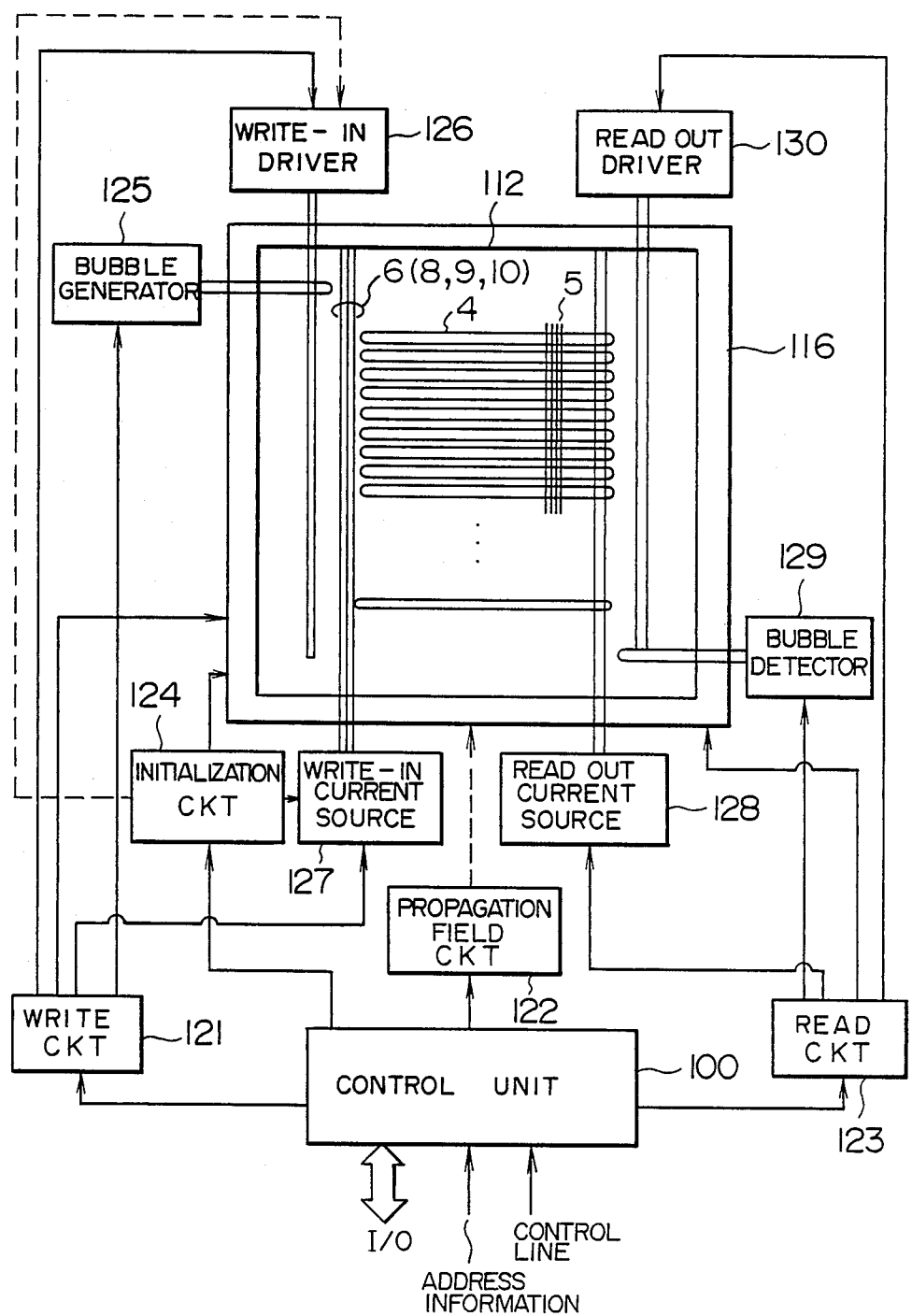
FIG. 4 is a schematic diagram of the arrangement of a Bloch line memory device in accordance with one embodiment of the present invention.

Now referring to FIG. 4, there is shown a Bloch line memory device in accordance with one embodiment of the present invention, comprising storage means, a magnetic. circuit 116, Bloch line pair writing means, Bloch line pair detecting means and a control unit 100. The storage means includes a plurality of stripe domains 4 formed on a film (memory chip) 112 of a ferromagnetic material, e.g. garnet. The magnetic circuit 116 serves to supply predetermined bias magnetic field and driving magnetic field to the memory chip 112. The Bloch line pair writing means includes members 121 to 124, 125 to 127, and at least one conductor (6, 8, 9, 10) arranged on the memory chip 112 so as to be substantially perpendicular to the lengthwise direction of the stripe domains 113. The Bloch line pair detection means includes members 123 and 128 to 130. The control unit 100 serves to control the write-in and read-out of information in the storage means. The unit 100 may be constituted by, for example, a 16-bit microprocessor.

One example of the operation of this device will be generally explained. When a write-in signal for a Bloch line pair for erasure is supplied by an external device, the control unit 100 sends a signal to a magnetic field circuit 122 for propagation control to specify a leading address for write-in. After this has been completed, the controller 100 sends a signal to an initialization circuit 124 to erase information existing at the write-in address. This erasure operation will be explained in detail later. After the information has been erased, the control unit 100 sends a signal to a write circuit 121. The write circuit 121 sends signals to the magnetic circuit 116 for controlling the positions of the end portions of the stripe domains and a bubble generator 125 for converting the information into the presence of a bubble. Thereafter, the write circuit 121 sends a signal to a write-in driver 126 to propagate the bubble and sends a signal to a write-in current source 127. Thus, the information represented by the presence of a bubble is converted into the presence (or absence) of a Bloch line pair, and written in the storage means 4.

The information is read out as follows. A read circuit 116 sends a signal to the magnetic circuit 116 and a read-out current source 128 to convert the stored information into the presence of a bubble and thereafter drives a read-out driver 130. Thus, the bubble is propagated to a bubble detector 129 and the information corresponding to the bubble is read out by a signal sent from the read circuit 123.

In the above erasure operation, the initialization circuit 124 sends a signal to the magnetic circuit 116 to stretch the stripe domains and thereafter sends a signal to the write-in driver 127 to write a Bloch line pair for erasure in the stripe domain 4. The write-in driver 127 serves to write two kinds of Bloch line pairs for information and its erasure by only changing the polarity of the current to be passed through the conductor for write-in. Therefore, it is not necessary to drive the write-in driver 126 to propagate an unnecessary bubble domain and erase it by a bubble erasing section 118, which was necessary in the prior art.

Referring to FIGS. 5a to 5e, and FIG. 9, the arrangement for information erasure and its operation in accordance with the present invention will be explained. In these figures, Bloch lines 1 in the direction of magnetization of the magnetic wall of a stripe domain and in the direction perpendicular thereto are indicated by arrows in accordance with the examples disclosed in U.S. Pat. No. 4,583,200 mentioned above. In the Figures, only one stripe domain in the storage means is considered. One storage (memory) loop is constituted by one stripe domain 4 and information is represented by the presence and absence of a Bloch line pair 3 located on the magnetic wall 11 of the stripe domain 4. The Bloch line pair 3 is propagated around along the magnetic wall 11 defining the stripe domain 4. Then, if the position where the Bloch line pair 3 is likely to stop is formed by each of bit patterns formed on the substrate surface, the Bloch line pair 3 is addressed in propagating it around along the magnetic wall 11.

In the case where the stored information is to be erased from the magnetic wall 11 of the stripe domain 4, a driving magnetic field is stopped at a predetermined timing so that a to-be-erased Bloch line pair 2 is located at one end portion of the stripe domain 4. Namely, as shown in FIG. 5a, in the state before the to-be-erased Bloch line pair 2 is erased, it is located at the head of the stripe domain 4.

Figure 5:
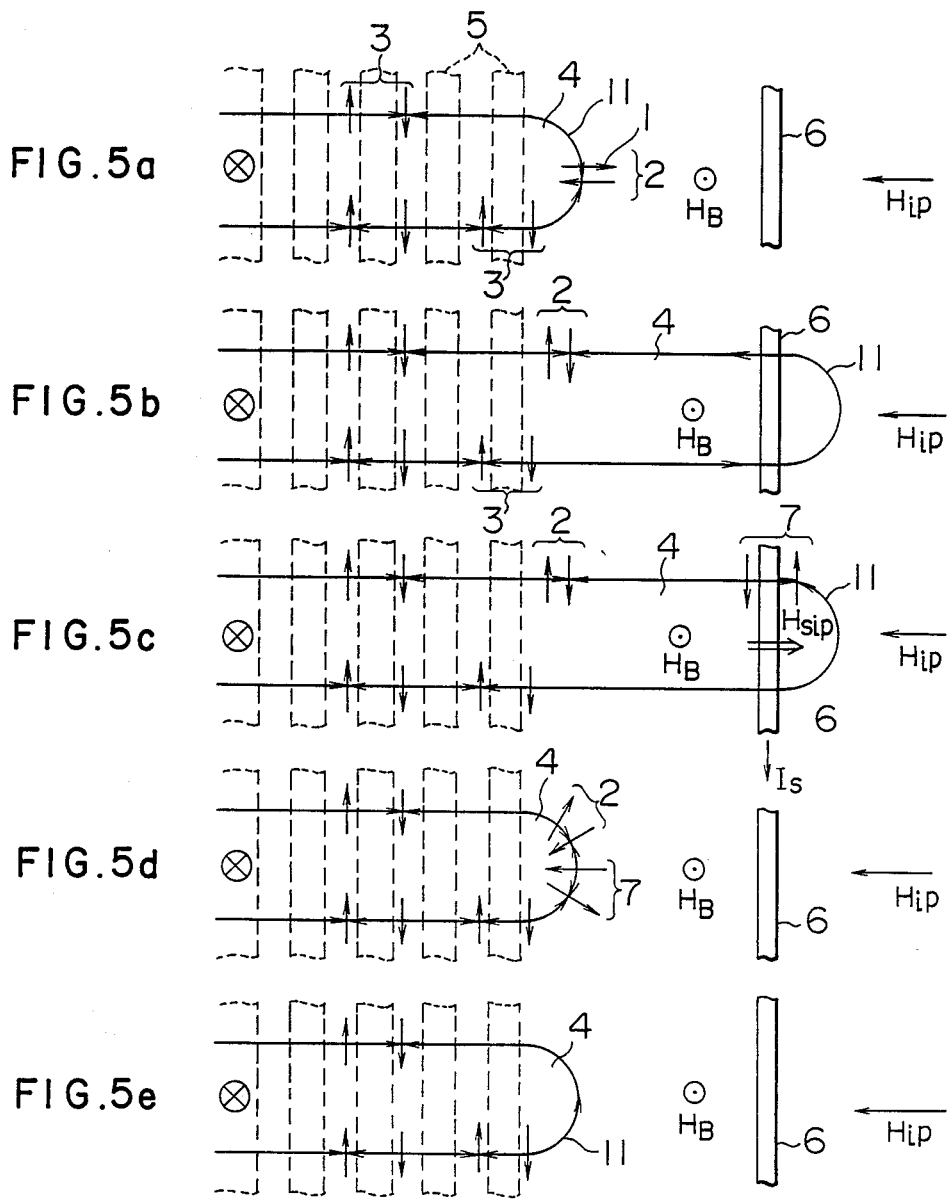
FIGS. 5a to 5e, 6a to 6e, and 7a to 7e are diagrams showing arrangements for information erasure and their operation in accordance with some embodiments of the present invention.
Figure 6:
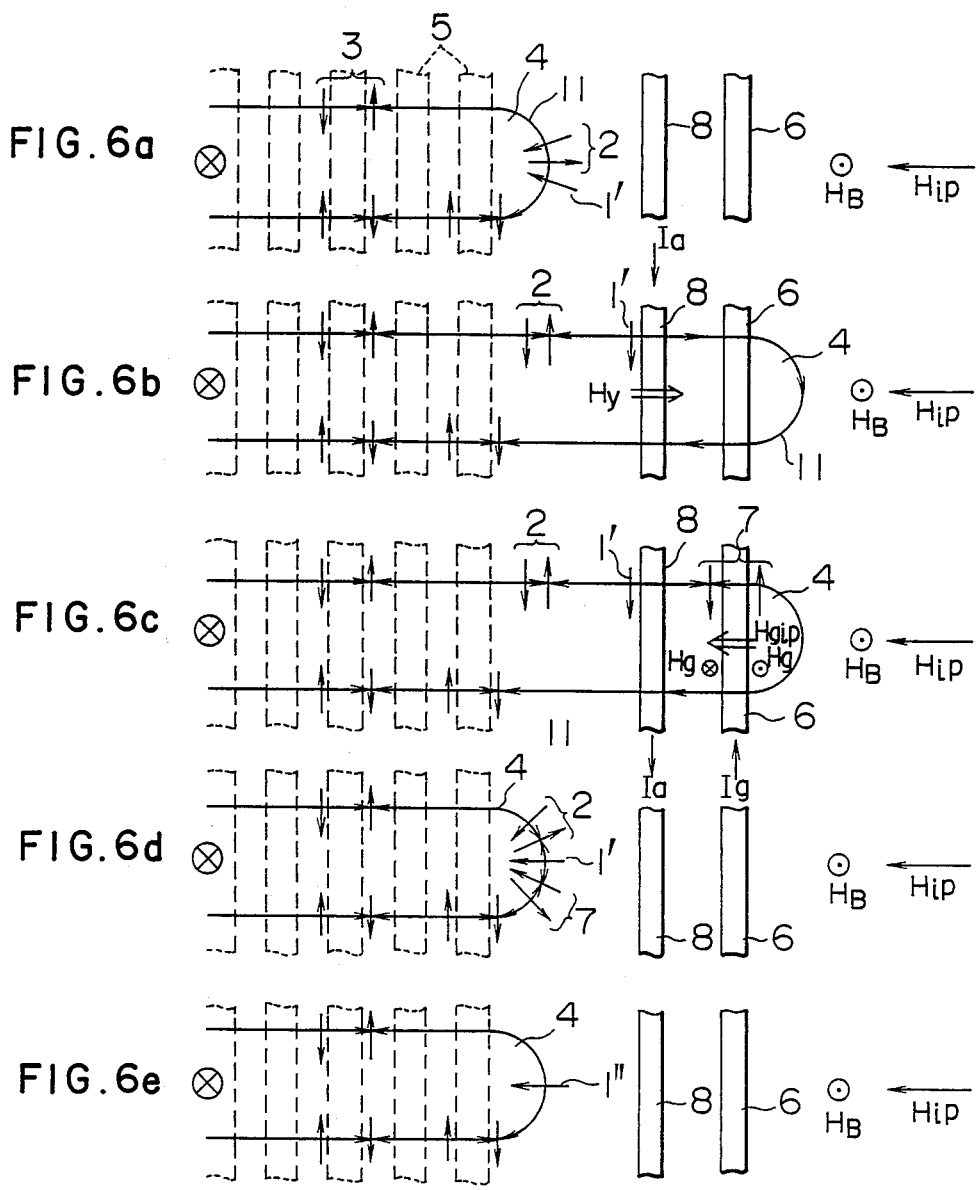
Figure 9:
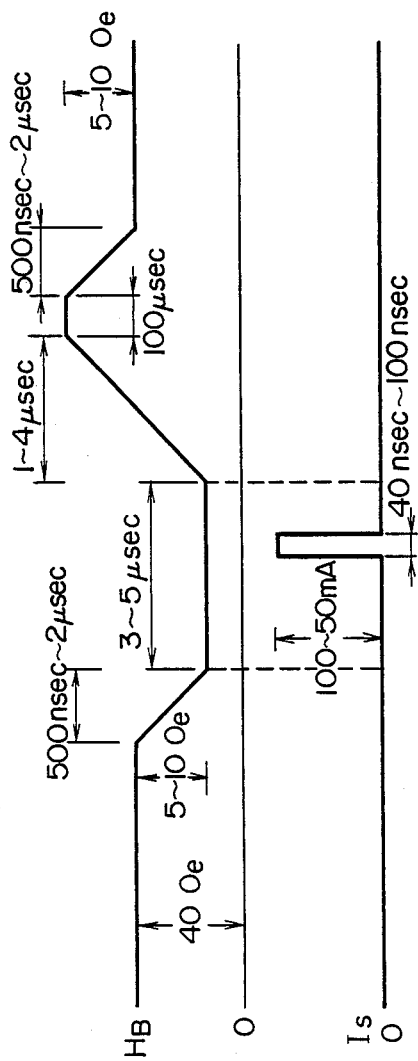

Next, by reducing the vertical bias magnetic field $H_B$ in its intensity by a predetermined amount in the direction of magnetization of the stripe domain 4 (in the downward direction as viewed on the plane of the drawing as indicated by mark   ), the stripe domain 4 is expanded or stretched in its lengthwise direction, resulting in a state as shown in FIG. 5b. The reduction in the bias magnetic field $H_B$ is moderately carried out so as not to produce undesired Bloch lines as shown in FIG. 9. When the stripe domain 4 is being stretched, the to-be-erased Bloch line pair 2 which has been located at the head of the stripe domain 4 is displaced in a counter-clockwise direction due to a gyroscopic force produced when the end portion of the stripe domain is moved. Thus, now the to-be-erased Bloch line pair 2 is not at the head of the stripe domain, but it is on one side thereof. In FIG. 5b, 6 is a write-in conductor provided through a non-magnetic insulating film at a position on the magnetic substrate so as to partly overlap the head of the stretched stripe domain 4. The write-in conductor 6 is arranged apart from the edge of the head of the stripe domain 4 before stretching by e.g. 40 μm or more and in the direction substantially perpendicular to the lengthwise direction of the stripe domain 4.

Thereafter, as shown in FIG. 5c, an abrupt pulse shape current $I_s$ as shown in FIG. 9 is caused to flow through the write-in conductor 6 overlapping the end portion of the stretched stripe domain 4 thereby to produce a strong in-plane magnetic field $H_{sip}$ immediately below the conductor 6, thus writing a Bloch line pair 7 for erasure (referred to as an erasure Bloch line pair) below the conductor 6.

After the above operation, as shown in FIG. 9, the vertical bias magnetic field $H_B$ is increased to a strength slightly larger than the initial strength and thereafter moderately decreased to the initial strength, to shrink the stripe domain 4, thereby restoring the same initial state as shown in FIG. 5a. Accordingly, as shown in FIG. 5d, both the to-be-erased Bloch line pair 2 and the erasure Bloch line pair 7 are present at the end portion of the stripe domain 4. Then, since the erasure Bloch line pair 7 is opposite to the to-be-erased Bloch line pair 2 in their rotation direction of magnetization, these Bloch line pairs are combined to cancel each other.

Figure 1:
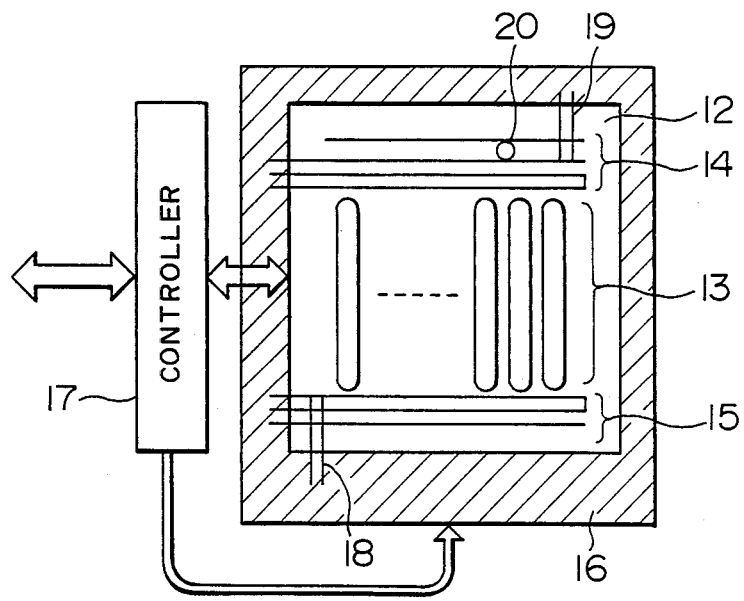
FIG. 1 is a schematic diagram of the prior art Bloch line memory device.
Figure 2:
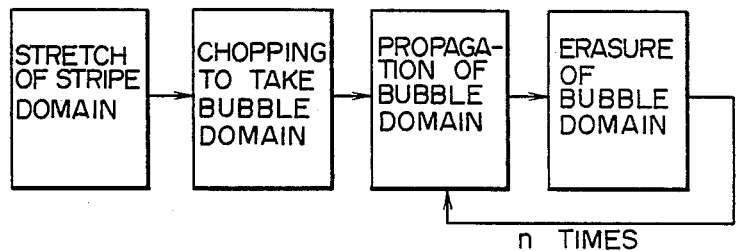
FIG. 2 is a view showing a procedure of erasing information in the prior art Bloch line memory device.
Figure 3:
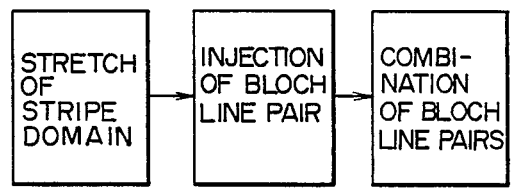
FIG. 3 is a view showing a procedure of erasing information in one embodiment of the present invention.

Thus, as shown in FIG. 5e, the state where a Bloch line pair is not present at the end portion of the stripe domain 4 can be reached. As seen from the comparison of this state with the state shown in FIG. 1, in the state of FIG. 5e, the information corresponding to the to-be-erased Bloch line pair 2 which has been located at the head of the stripe domain 4 has disappeared.

Figure 8:
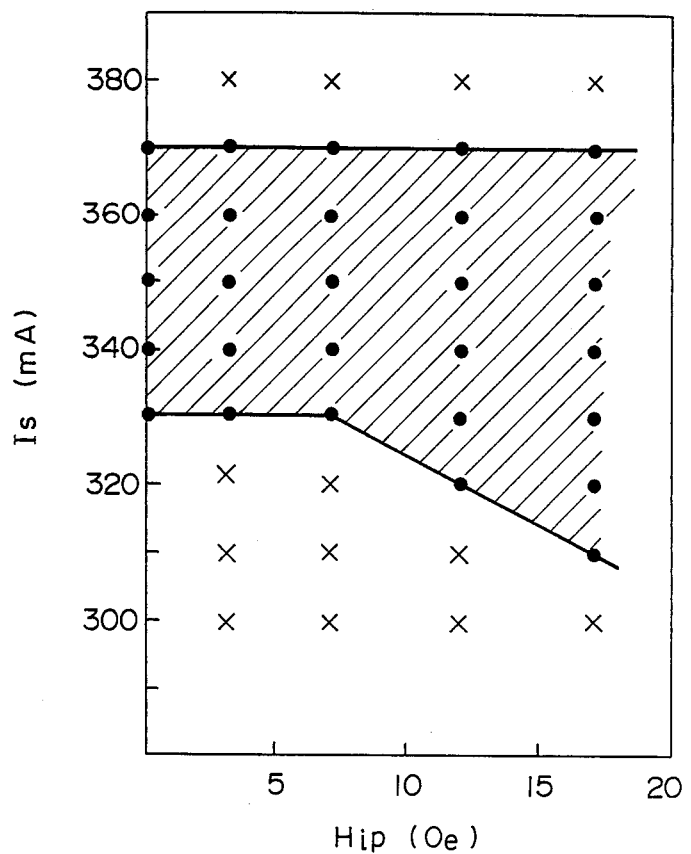
FIG. 8 is a diagram showing operation margins for writing a Bloch line pair for erasure using a single conductor shown in FIGS. 5a to 5e and 6a to 6e.

The gist of the present invention is to write in an erasure Bloch line pair, and more specifically to write in the erasure Bloch line pair having a rotation direction of magnetization opposite to that of a to-be-erased Bloch line pair. In this embodiment, a method of writing using one conductor is adopted. This method is to cause a pulse current $I_s$ to flow through one write-in conductor 6 to produce a strong in-plane magnetic field $H_{sip}$ immediately below the conductor and thus inject a microstructure of magnetization called a Bloch point into the magnetic wall 11 thereby to write in the Bloch line pair 7. The experimental data in the range of the write-in operation are shown in FIG. 8. FIG. 8 shows the operation range (including black points) of the write-in current $I_s$ obtained using as a parameter the in-plane magnetic field $H_{ip}$ for maintaining the Bloch line pair 3. As seen from FIG. 8, the operation range of the write-in current $I_s$ at the in-plane magnetic field Hip having a strength of 3 Oe is 330 mA to 370 mA, which is a practicably wide operation margin. Although this result is an experimental result in the case where a conductor film of 5 μm wide is provided on a magnetic garnet film of a CaGe system having stripe domains of 5 μm wide through a non-magnetic insulating film spacer of 2 μm thick, it has been confirmed that the other magnetic garnet provides a similar wide operation margin. The success or failure of the write-in has been judged by a so-called rocking method which vibrates the stripe domain and recognizes the state of the written Bloch line pair from its moving direction. From this experiment, it has been found that the rotation direction of magnetization in a written Bloch line pair is reversed depending on the direction of a write-in current $I_s$. Therefore, by the use of a write-in current $I_s$ having a polarity determined on the basis of the rotation direction of magnetization in the Bloch line pair as an information carrier, it is possible to write a Bloch line pair having the rotation direction of magnetization opposite to that of the information carrying Bloch line pair, thereby erasing the information. Additionally, the width of the write-in conductor may be e.g. 2.5 μm to 5 μm for the width of 5 μm in the stripe domain.

Now referring to FIGS. 6a to 6e and FIG. 10, another arrangement for erasing information and its operation will be explained. This embodiment is also applicable to the stripe domain of a S=0 structure. The S=0 structure refers to a magnetization state where all the directions of magnetization in the magnetic wall 11 around the stripe domain are the same. In this structure, one Bloch line 1' is present at the head of each of the stripe domains 4. Therefore, if the information (Bloch line pair) 2 is present at the end portion of the stripe domain 4, three Bloch lines are present there as shown in FIG. 6a. Further, conductors 6 and 8 are arranged on the magnetic substrate through an insulating film to be spaced from the stripe domain and substantially parallel with and spaced from each other in the direction perpendicular to the lengthwise direction of the stripe domain 4. The conductor 6 serves to position or temporarily intercept a Bloch line and the conductor 8 serves as a write-in conductor.

Figure 10:
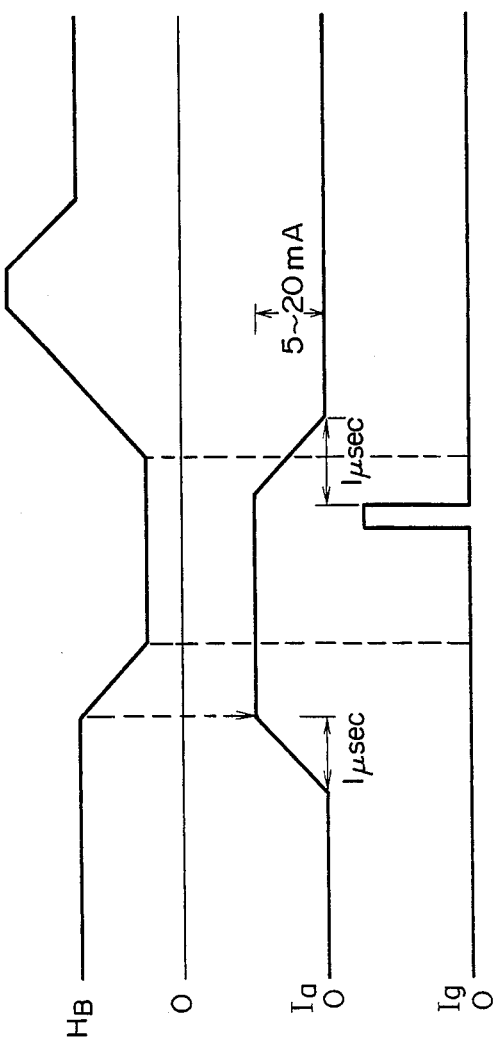

In order to erase the information in this state, as in the arrangement shown in FIGS. 5a to 5e, the vertical bias magnetic field $H_B$ is decreased in its intensity to a predetermined strength as shown in FIG. 10 to stretch the stripe domain 4 to a position beyond the conductors 6 and 8 as shown in FIG. 6b. Then, the to-be-erased Bloch line pair 2 is left on a side of the stripe domain 4 for the reason mentioned above, but the Bloch line 1', after once having moved to the side of the stripe domain, moves again toward the end portion of the stripe domain 4 due to the in-plane magnetic field $H_{ip}$ for maintaining the Bloch line pairs. The Bloch line 1' is not related with the write-in of an erasure Bloch line pair. Therefore, the Bloch line 1' is temporarily intercepted immediately below the conductor 8 by the inplane magnetic field $H_y$ generated by passing a current pulse $I_a$ as shown in FIG. 10 through the conductor 8 (see FIG. 6b). Incidentally, the current pulse $I_a$ is set to rise before the bias magnetic field $H_B$ starts to decrease, and its amplitude is set to provide $H_y > H_{ip}$. The rise and fall of $I_a$ are moderately but not abruptly carried out.

The magnetization state from the conductor 8 to the end portion of the stripe domain 4 is the same as FIG. 5b. Thus, if an erasure abrupt pulse current as shown in FIG. 10 is caused to flow through the conductor 6 while the current pulse $I_a$ exists in the conductor 8, the erasure Bloch line pair 7 can be written immediately below the conductor 6 as shown in FIG. 6c. It is necessary to determine the polarity of the current pulse $I_g$ such that the erasure Bloch line pair 7 is made to be opposite, in its rotation direction of magnetization, to the Bloch line 1' adjacent thereto.

Thereafter, as in the arrangement of FIG. 5d, the bias magnetic field $H_B$ is varied as shown in FIG. 10 to shrink the stripe domain 4, so that five Bloch lines are present at the end portion as shown in FIG. 6d. And, the Bloch line 1' is combined with one of the erasure Bloch line pair 7 and one of the to-be-erased Bloch line pair 2 is combined with the other of the erasure Bloch line pair 7. Accordingly, the other of the to-be-erased Bloch line pair, i.e. only one Bloch line 1" which is equivalent to the Bloch line 1' which is now present at the head of the stripe domain 4, remains (see FIG. 6e). The current pulse $I_a$ flowing in the conductor 8 is also supplied from the current source 127 shown in FIG. 4.

Although the above two embodiments relate to the case where an erasure Bloch line pair is written using one conductor, the present invention can also be accomplished utilizing a method of writing a Bloch line pair. This case will be explained with reference to FIGS. 7a to 7e and FIG. 11.

Figure 7:
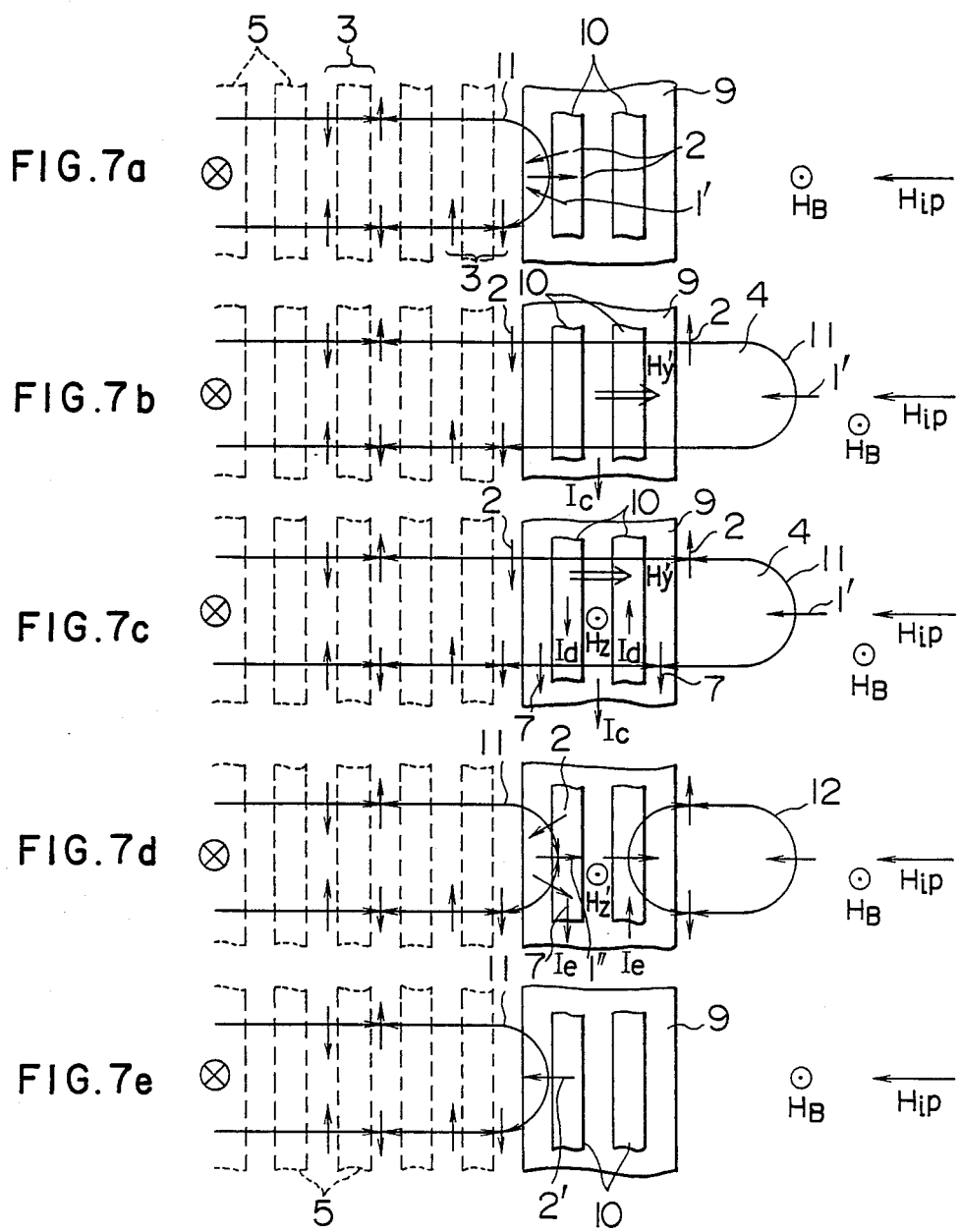

FIG. 7a, as in the arrangement shown in FIGS. 6a to 6e, shows the manner in which there are one Bloch line 1' and the to-be-erased Bloch line pair 2 at the end portion of the stripe domain 4 of an S=0 structure. In this FIG. 9 represents a wide conductor formed on the magnetic substrate through an insulating film to be in the direction substantially perpendicular to the lengthwise direction of the stripe domain 4 and to slightly overlap, in its one periphery, the end portion of the stripe domain 4. Numerals 10 represent chopping conductors formed on the wide conductor 9 through an insulating film to be in the direction substantially perpendicular to the lengthwise direction of the stripe domain 4 and to be electrically connected to each other in their ends. The chopping conductors 10 are supplied with currents having same amplitude in opposite directions as viewed on the plane of the drawing sheet.

In an erasure operation, as shown in FIG. 7b, the bias magnetic field $H_B$ is reduced to a predetermined strength as shown in FIG. 11 to stretch the stripe domain 4 so that its end portion goes beyond the wide conductor 9. In this state, a current pulse $I_c$ is caused to flow through the wide conductor 9 to provide an in-plane magnetic field $H_y'$. As shown in FIG. 11, current pulse $I_c$ starts to rise after the bias magnetic field $H_B$ has been reduced to a predetermined level. The amplitude of $I_c$ is set to provide the relation $H_y' > H_{ip}$ ($H_{ip}$ is for maintaining the Bloch line pairs 3). The rise and fall of $I_c$ are moderately carried out. Then, the to-be-erased Bloch line pair 2, due to the in-plane magnetic field $H_y'$ produced from the conductor 9, are moved from the end portion of the stripe domain 4 to be separated below both edges of the conductor 9 on the upper (or lower) side of the magnetic wall and intercepted by the conductor 9. Since the direction of magnetization on the lower (or upper) side of the magnetic wall is opposite to that of $H_y'$, it becomes likely to be reversed.

Next, as shown in FIG. 7c, if a current pulse $I_d$ for writing an reasure Bloch line pair as shown in FIG. 11 is caused to flow through the chopping conductors 10 to apply the vertical magnetic field $H_z$ in the upward direction as viewed on the plane of the drawing sheet to the stripe domain 4, the erasure Bloch line pair 7 is written in below the chopping conductors 10 on the lower side of the magnetic wall. Two Bloch lines constituting the erasure Bloch line pair 7, unlike the cases of the arrangements of FIGS. 5a to 5e and FIGS. 6a to 6e, are different from each other in their rotation direction of magnetization, i.e. have the same sense (outward direction from the stripe domain) in the direction perpendicular to the magnetic wall. In this embodiment, $I_d$ is set so that its polarity provides a Bloch line having the rotation direction opposite to the to-be-erased Bloch line.

After the application of the write-in current pulse $I_d$ has been completed, a chopping current pulse $I_e$ as shown in FIG. 11 is caused to flow again through the chopping conductors 10 to apply the vertical magnetic field $H_z'$ to the stripe domain 4 while the intercept current pulse $I_c$ remains in the conductor 9. Then, the stripe domain 4 is chopped at the chopping conductors 10 and an additional Bloch line 1" is produced at the end portion of the remaining stripe domain 4 as shown in FIG. 7d. This Bloch line 1' always has the same rotation of magnetization as the to-be-erased Bloch line pair 2. Thus, the Bloch line 1" is combined with one of the erasure Bloch line pair 7 and they disappear. Only one of the to-be-erased Bloch line pair 2 remains, as a Bloch line 2', in the magnetic wall 11 of the stripe domain 4.

In order to implement this embodiment, the rotation direction of magnetization in the Bloch line pair 7 written for erasure must be considered. More specifically, as apparent from FIGS. 7c and 7d, the information is erased when the leftside (storage means side) Bloch line of the written Bloch line pair 7 is combined with the Bloch line 1" produced when the stripe domain has been chopped. Therefore, the polarity is selected so that the leftside Bloch line is combined with the Bloch line produced when the stripe domain has been chopped which has the same rotation of magnetization as the information carrier. Otherwise, two Bloch lines 7 in an inward direction with respect to the magnetic wall are produced, thus making it impossible to complete the erasure operation.

By erasing a domain 12, produced when the stripe domain 4 has been chopped, in accordance with a prescribed procedure, the state as shown in FIG. 7e results. From the comparison of this state with the initial state shown in FIG. 7a, it can be seen that the information at the end of the stripe domain 4 has been erased.

Additionally, the bias magnetic field $H_B$ in FIGS. 10 and 11 is the same waveforms as that in FIG. 9 and the current pulse $I_g$ for writing an erasure Bloch line pair in FIG. 10 is the same waveform as that of the current pulse $I_s$ in FIG. 9.

We claim:
1. A Bloch line memory device comprising:
   storage means including a plurality of stripe magnetic domains formed in a magnetic film;
   means for writing a Bloch line pair in said storage means, said writing means including at least one slender conductor arranged substantially perpendicular to the lengthwise direction of said stripe domains and means for supplying a first electric current pulse signal to one of said at least one conductor to inject an erasure Bloch line pair into one end portion of a stripe domain having a to-be-erased Bloch line pair in the one end portion, the direction of rotation of magnetization of the erasure Bloch line pair being opposite to that of the to-be-erased Bloch line pair;

means for detecting a Bloch line pair to read information in said storage means;

means for applying a bias magnetic field to hold said stripe magnetic domains in said ferromagnetic film; and means for controlling said bias magnetic field applying means to stretch the stripe domain having a to-be-erased Bloch line pair in its end portion at least for a period of time in which said first electric current pulse signal is supplied to said one conductor and to shrink said stripe domain having a to-be-erased Bloch line pair to combine said to-be-erased Bloch line pair with said erasure Bloch line pair to cancel said to-be-erased Bloch line pair.

2. A Bloch line memory device according to claim 1, in which said at least one conductor includes a single slender conductor for generation of an erasure Bloch line pair.

3. A Bloch line memory device according to claim 1, in which said at least one conductor includes first and second slender conductors arranged so as to be spaced from said stripe domains and substantially parallel with and spaced from each other, said first conductor farther from said stripe domains than said second conductor being arranged to be supplied with said first electric current pulse signal for generation of an erasure Bloch line pair, said second conductor being for temporary interception of a Bloch line employed for a S=0 structure for said Bloch line memory device, and the device further comprises means for supplying a second electric current pulse signal to said second conductor to generate an interception magnetic field for said temporary interception, said supply of said first electric current pulse signal being effected while said second electric current pulse signal is existing.

4. A Bloch line memory device according to claim 1, in which said at least one conductor includes a first slender conductor and a pair of mutually spaced second slender conductors formed over and in an electrically insulated relation with said first conductor, ends of said pair of second conductors being electrically connected with each other, said first conductor having a width larger than the sum of the widths of said pair of second conductors and a spacing therebetween and being arranged so as to partly overlap end portions of said stripe domains, one of said pair of second conductors nearer to said stripe domains than the other being substantially joined with the end portions of the stripe domains as viewed in a direction parallel with the magnetic wall of said stripe domains, said pair of second conductors being arranged to be supplied with said first electric current pulse signal, the device further comprises means for supplying a second electric current pulse signal to said first conductor to temporarily intercept a to-be-erased Bloch line pair in one end portion of a stripe domain and means for supplying a third electric current pulse signal to said pair of second conductors after termination of said first electric current pulse signal to chop said end portion of the stretched stripe domain, said supply of said first and third electric current pulse signals being effected while said second electric current pulse signal is existing.

5. A method of erasing information in Bloch line memory device having storage means including stripe magnetic domains held under a bias magnetic field and conductor means including at least one slender conductor arranged substantially perpendicular to the lengthwise direction of said stripe domains, the method comprising the steps of:

stretching a stripe magnetic domain having a to-be-erased Bloch line pair in its end portion so that said one end portion of the stripe domain overlaps said conductor;

supplying an electric current pulse signal to one of said at least one conductor to inject an erasure Bloch line pair into said one end portion of said stretched stripe domain, the direction of rotation of magnetization of said erasure Bloch line pair being opposite to that of said to-be-erased Bloch line pair; and shrinking said stretched stripe domain to combine said to-be-erased Bloch line pair with said erasure Bloch line pair thereby to cancel said to-be-erased Bloch line pair.

6. A method according to claim 5, in which said stripe domain stretching is carried out by decreasing the intensity of said bias magnetic field and said stripe domain shrinking is carried out by restoring the intensity of said bias magnetic field.

7. A method according to claim 5, further comprising the step of intercepting a Bloch line, if any, in one end portion of said stripe domain to be stretched between said stripe domain stretching step and said electric current pulse signal supplying step.

8. A method of erasing information in Bloch line memory device having storage means including stripe magnetic domains held under a bias magnetic field and conductor means including a first slender conductor and a second slender conductor formed over and in an electrically insulated relation with said first conductor, both of said first and second conductors being arranged substantially perpendicular to the lengthwise direction of said stripe domains, the method comprising the steps of:

stretching a stripe magnetic domain having a to-be-erased Bloch line pair in its end portion so that said one end portion of the stripe domain overlaps said first and second conductors;

intercepting said to-be-erased Bloch line pair in said end portion of said stretched stripe domain by supplying an interception current pulse signal to said first conductor;

supplying, while said interception current pulse signal is existing, an erasure electric current pulse signal to said second conductor to inject an erasure Bloch line pair into said one end portion of the stretched stripe domain, the direction of rotation of said erasure Bloch line pair being opposite to that of said to-be-erased Bloch line pair;

supplying, while said interception current pulse signal is existing and after termination of said erasure electric current pulse signal, a chopping electric current pulse signal to said second conductor to chop said end portion of said stretched stripe domain; and shrinking said stripe domain to combine said to-be-erased Bloch line pair with said erasure Bloch line pair thereby to cancel said to-be-erased Bloch line pair.

9. A Bloch line memory device using, as information carriers, Bloch line pairs located in magnetic walls defining a plurality of stripe domains which are arranged in parallel in a magnetic film which is easily magnetized in a direction perpendicular to the film surface, comprising:

means for injecting an erasure Bloch line pair having a different magnetization structure from that of a to-be-erased Bloch line pair at a location in the magnetic wall adjacent to the to-be-erased Bloch line pair; and means for combining said to-be-erased Bloch line pair with said erasure Bloch line pair to erase the information corresponding to the to-be-erased Bloch line pair.

* * * * *